United States Patent
Tsuboyama et al.

(10) Patent No.: US 6,835,471 B2
(45) Date of Patent: Dec. 28, 2004

(54) LIGHT EMITTING DEVICE AND DISPLAY UNIT WHICH MAKE USE OF PORPHYRIN DERIVATIVE COMPOUND

(75) Inventors: Akira Tsuboyama, Kanagawa (JP); Shinjiro Okada, Kanagawa (JP); Takao Takiguchi, Tokyo (JP); Seishi Miura, Kanagawa (JP); Takashi Moriyama, Kanagawa (JP); Jun Kamatani, Kanagawa (JP); Manabu Furugori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 121 days.

(21) Appl. No.: 10/094,820

(22) Filed: Mar. 12, 2002

(65) Prior Publication Data

US 2003/0034722 A1 Feb. 20, 2003

(30) Foreign Application Priority Data

Mar. 14, 2001 (JP) ........................................ 2001-072664
Feb. 22, 2002 (JP) ........................................ 2002-046195

(51) Int. Cl.⁷ .............................................. H05B 33/14
(52) U.S. Cl. ....................... 428/690; 428/917; 313/504; 257/40; 257/88
(58) Field of Search ................................ 428/690, 917; 313/504, 506; 540/145; 257/40, 88, 102, 103

(56) References Cited

U.S. PATENT DOCUMENTS 5,327,373 A * 7/1994 Liu et al.
6,303,238 B1 * 10/2001 Thompson et al. ......... 428/690
6,333,122 B1 * 12/2001 Furukawa et al. .......... 428/690

FOREIGN PATENT DOCUMENTS

DE 43 43 412 A1 * 6/1995
JP 11-97176 4/1999

OTHER PUBLICATIONS

M.A. Baldo et al. "Very High–Efficiency Green Organic Light–Emitting Devices Based on Electrophosphorescence," 75(1) *Applied Phys. Lett.* 4–6 (Jul. 1999).

Brian A. Gregg et al., "2,3,7,8,12,13,17,18–Octakis(β–hydroxyethyl)porphyrin(Octaethanolporphyrin) and Its Liquid Crystalline Derivatives: Synthesis and Characterization," 111 *J. Am. Soc.* 3024–3029 (1989).

D.F. O'Brien et al., "Improved Energy Transfer in Electrophosphorescent Devices," 74(3) *Applied Phys. Lett.* 442–444 (Jan. 1999).

* cited by examiner

Primary Examiner—Marie Yamnitzky
(74) Attorney, Agent, or Firm—Fitzpatrick, Cella, Harper & Scinto (57) ABSTRACT

A light emitting device is disclosed having a light emitting layer containing a porphyrin derivative compound each pyrrole group of which is characterized by having a straight-chain or branched side-chain alkyl group having 5 to 20 carbon atoms, and the central metal of which is Cr, Ni, Cu, Co, Ru, Rh, Pd, Ir, Pt or Au. The compound is light-emissive and especially has phosphorescent light emission properties and liquid crystal properties. Also disclosed is a display unit using the light emitting device.

10 Claims, 3 Drawing Sheets

LIGHT EMITTING DEVICE AND DISPLAY UNIT WHICH MAKE USE OF PORPHYRIN DERIVATIVE COMPOUND

BACKGROUND OF THE INVENTION

1. Field of the Invention

This invention relates to a porphyrin derivative compound, and a light emitting device and a display unit which make use of same. More particularly, it relates to a light emitting device and a display unit which have as a constituent material a porphyrin derivative compound which is a porphyrin metal coordination compound or a porphyrin compound and exhibits liquid crystal properties or exhibits phosphorescent or fluorescent light emission properties. This invention also relates to a material having high charge injection performance, utilizing such liquid crystal properties.

2. Related Background Art

In the research on porphyrin derivative compounds, it is hitherto known that porphyrin derivative compounds made to have a long side chain are capable of controlling intermolecular mutual action. For example, it is also known that the porphyrin derivative compounds having a long side chain exhibit a discotic liquid crystal phase. With regard to discotic liquid crystal properties of a porphyrin compound itself, however, the number of compounds exhibiting liquid crystal properties are not large, because it has not been long since the research was commenced.

As an example of such discotic liquid crystal compounds using the porphyrin skeleton, there is a Brian A. Gregg et al paper, Journal of American Chemical Society 1989, 111, 3024–3029, which discloses the structure of compounds using hydrogen (H), zinc (Zn), Copper (Cu), palladium (Pd) or cadmium (Cd) for the central metal and a temperature range in which a discotic liquid crystal phase is exhibited.

In the case of the compound using zinc as the central metal, there is an example in which the temperature at which a phase transition into the discotic liquid crystal phase is caused is at least 61° C. In other examples, however, the temperature is 84° C. or above, and the compounds that exhibit the discotic liquid crystal phase at around room temperature are still unknown.

An example is also disclosed in which, utilizing a regularity the discotic liquid crystal has, a high mobility has been achieved as an electron mobile layer of an organic EL (organic electroluminescence) device (e.g., Japanese Patent Application Laid-open No. 11-97176). In this example, it is disclosed that, as attempted in solid electrolytes, a structure in which the discotic liquid crystal has been oriented in a specific direction is made up so as to improve charge transportability due to hopping conduction. In the text of this publication, the porphyrin skeleton is described as one of the core structures of compounds for the charge transporting materials. Namely, it is stated that a good charge transport layer can be formed using the discotic liquid crystal. However, the disclosure is limited to the utilization as a charge transport layer having a large charge mobility.

With regard to organic EL devices using porphyrin compounds, the following publications 1 and 2 disclose devices making use of a platinum-porphyrin complex (PtEP) as a light emitting material and show the effectiveness of porphyrin materials as light emitting materials. In particular, devices are studied which utilize not fluorescent light emission via a singlet exciton but phosphorescent light emission via a triplet exciton, and are expected to be effective to improve light emission efficiency.

Publication 1: "Improved Energy Transfer in Electrophosphorescent Devices" (D.F. O'Brien et al., Applied Physics Letters, vol. 74, No. 3, p. 442 (1999)).

Publication 2: "Very High-Efficiency Green Organic Light-Emitting Devices Based on Electrophosphorescence" (M.A. Baldo et al., Applied Physics Letters, vol. 75, No. 1, p. 4 (1999)).

Figure 3A:
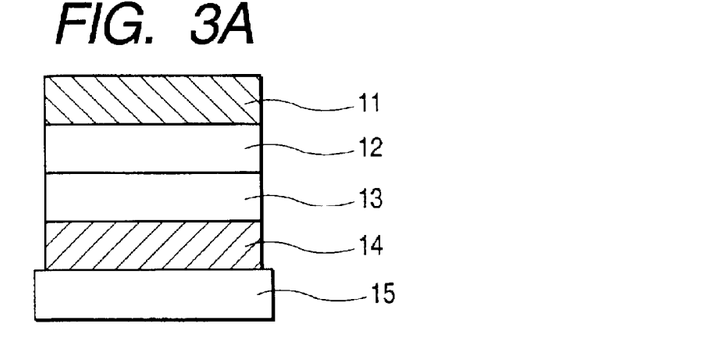
FIGS. 3A and 3B are sectional views showing examples of an organic EL device.
Figure 3B:
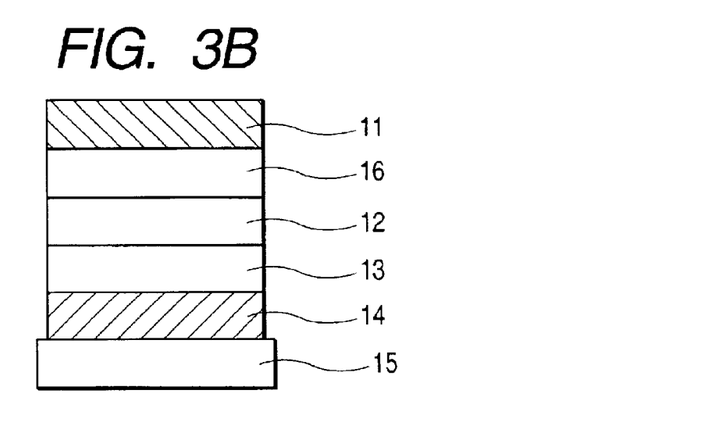

Here, the construction of commonly available organic EL devices is shown in FIGS. 3A and 3B. In these devices, a plurality of organic layers are present between a transparent electrode 14 on a transparent substrate 15 and a metal electrode 11. In the device shown in FIG. 3A, the organic layers consist of a light emitting layer 12 and a hole transport layer 13. As the transparent electrode 14, a material having a large work function, such as ITO (indium-tin oxide), is used so that it can be endowed with good hole injection performance from the transparent electrode into the hole transport layer. As the metal electrode 11, a metallic material having a small work function, such as aluminum, magnesium or an alloy formed using these, is used so that it can be endowed with good electron injection performance into the organic layer. These electrodes are formed in a layer thickness of 50 to 200 nm.

In the light emitting layer, an aluminum-quinolinol complex or the like (a typical example is Alq3 shown below) having electron transport properties and light emission properties is used.

In the hole transport layer, a material having electron-donating properties as exemplified by a biphenyldiamine derivative (a typical example is α-NPD shown below) is used.

In the device shown in FIG. 3B, an electron transport layer 16 is further provided between the metal electrode 11 and the light emitting layer 12 which are shown in FIG. 3A. The light emission is separated from the electron transport and hole transport to provide a more effective carrier blocking construction, so that an effective light emission can be performed. As materials for the electron transport layer, an oxadiazole derivative or the like may be used.

Figure 4:
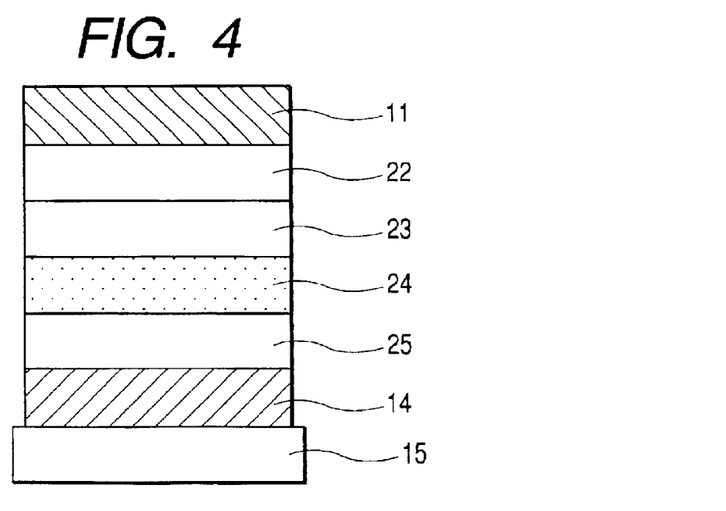
FIG. 4 is a sectional view showing another example of an organic EL device.

In the above publications 1 and 2, such a four-layer organic-layer construction as shown in FIG. 4 is chiefly used. It is constituted of, in this order from the anode side, a hole transport layer 25, a light emitting layer 24, an exciton diffusion preventive layer 23 and an electron transport layer 22. Materials used are carrier transport materials and phosphorescent light emitting materials as shown below.

Alq3: Aluminum-quinolinol complex.

α-NPD: N4,N4'-di-naphthalen-1-yl-N4,N4'-diphenyl-biphenyl-4,4'-diamine.

CBP: 4,4'-N,N'-dicarbazole-biphenyl.

BCP: 2,9-Dimethyl-4,7-diphenyl-1,10-phenanthroline.

PtOEP: platinum-octaethylporphyrin complex.

Ir(ppy)$_3$: Iridium-phenylpyrimidine complex.

Alq 3

In both the above publications 1 and 2, the device construction which contributes to the high efficiency is the construction that, as host materials, the α-NPD is used in the hole transport layer, the Alq3 in the electron transport layer, the BCP in the exciton diffusion preventive layer and the CBP in the light emitting layer, and the phosphorescent light emitting material PtOEP or Ir(ppy)$_3$ is mixed in a concentration of about 6%.

However, the PtOEP disclosed in the above publication has two carbon atoms in the side chain, and has no liquid crystal properties by itself. It is only used as a light emitting material. Also, its concentration with respect to the host materials is 6%. Accordingly, in order to allow the device to have a higher efficiency, it is expected to be used in a much higher concentration.

As stated above, it is shown that an organic EL device having a high light emission efficiency can be provided using the compound having phosphorescent light emission properties. The device, however, is still not one which can be satisfactory, inclusive of its emission luminance. In general, phosphorescence is often observable at a low temperature of about 77 K, and is not observable at room temperature. The phosphorescent light emitting material or compound herein referred to indicates a compound whose phosphorescent light emission is perceivable within a temperature range near room temperature (0° C. or above), required in practical use.

SUMMARY OF THE INVENTION

The present invention was made taking into account conventionally known techniques. Accordingly, an object of the present invention is to provide a light emitting device such as an organic EL device, making use of a porphyrin derivative compound.

Another object of the present invention is to provide a porphyrin derivative compound having a high stability as a light emitting material especially used in organic EL devices and as a charge injection material.

Still another object of the present invention is to provide a light emitting device making use of a multifunction porphyrin derivative compound which is light-emissive and especially has phosphorescent light emission properties and liquid crystal properties simultaneously.

A further object of the present invention is to provide a highly luminous and stable light emitting device having a layer containing the above multifunction porphyrin derivative compound, and a display unit having such a device.

The present invention provides a light emitting device comprising a substrate, a pair of electrodes provided on the substrate, and a light emitting portion containing at least one organic compound, provided between the electrodes; the organic compound being a porphyrin derivative compound represented by the following Formula (1) or (2). In particular, it is limited to a compound having a relatively long side chain in which the number of carbon atoms of the side-chain alkyl group is 5 to 20.

(1)

(2)

wherein R or R' represents a straight-chain or branched alkyl group which may be substituted with a halogen, provided that the number of carbon atoms contained in the alkyl group is 5 to 20 and one methylene group, or two or more methylene groups not adjacent to each other, in the alkyl group may be replaced with —O—, —S—, —CO—, —CO—O—, —O—CO—, —CH=CH— or —C≡C—; and M is Cr, Ni, Cu, Co, Ru, Rh, Pd, Ir, Pt or Au, which M may be combined with a halogen, an oxygen, —OH or =CO.

In particular, the present invention may be a light emitting device in which M in the compound represented by Formula (1) is Pd, Cu, Pt or Au and M may be combined with a halogen, an oxygen, —OH or =CO.

The present invention also provides a light emitting device comprising a layer containing the porphyrin derivative compound represented by Formula (1) or (2).

The present invention may also preferably be a device in which the layer containing the porphyrin derivative compound represented by Formula (1) or (2) is interposed between two electrodes opposite to each other, and capable of emitting light upon application of a voltage across the electrodes.

The present invention may still also preferably be a device in which the layer containing the porphyrin derivative compound represented by Formula (1) or (2) is interposed between two electrodes opposite to each other, and capable of acting as a charge injection layer upon application of a voltage across the electrodes.

The present invention still also provides a display unit comprising the above light emitting device.

DESCRIPTION OF THE PREFERRED EMBODIMENTS

The present invention is described below in detail.

The light emitting device of the present invention making use of a porphyrin derivative compound is characterized by using a compound represented by the following Formula (1) or (2).

(1)

(2)

In the formula, R or R' represents a straight-chain or branched alkyl group which may be substituted with a halogen, provided that the number of carbon atoms contained in the alkyl group is 5 to 20, and preferably 5 to 15, and one methylene group, or two or more methylene groups not adjacent to each other, in the alkyl group may be replaced with —O—, —S—, —CO—, —CO—O—, —O—CO—, —CH=CH— or —C≡C—.

The central atom M is Cr, Ni, Cu, Co, Ru, Rh, Pd, Ir, Pt or Au, and may be combined with a halogen, an oxygen, —OH or =CO.

The compound represented by Formula (1) may preferably be a compound in which the central metal M is Rh, Pd, Cu, Ir, Pt or Au and may be combined with a halogen, oxygen, —OH or =CO.

The compound represented by Formula (1) or (2) may preferably be a light emitting compound.

The compound represented by Formula (1) or (2) may preferably be a phosphorescent light emitting compound.

Utilizing such a feature that the compound represented by Formula (1) or (2) has a high charge injection performance, it may preferably be used as a charge injection material for a charge injection layer.

The compound represented by Formula (1) or (2) may preferably be a compound showing a liquid crystal phase.

The compound represented by Formula (1) or (2) may preferably be a compound showing a discotic liquid crystal phase.

Specific structural formulas of the porphyrin derivative compound used in the present invention are shown in Tables 1 to 13 below. These only show typical examples, and the present invention is by no means limited to these.

Letter symbols used in "side-chain symbol" in these Tables represent the following moiety structures of R or R'. Also, Tables 1 to 12 and 14 show specific examples of the compound represented by Formula (1); and Table 13 shows specific examples of the compound represented by Formula (2).

R or R': Moiety Chemical Structures

A:

—$C_nH_{2n+1}$

B:

—$OC_nH_{2n+1}$

C:

—$SC_nH_{2n+1}$

D:

—$COOC_nH_{2n+1}$

E:

—$COC_nH_{2n+1}$

F:

—$CH_2CH=CHC_nH_{2n+1}$

G:

—$CH_2C\equiv CC_nH_{2n+1}$

H:

$$—O—C_mH_{2m}-\underset{\underset{CF_3}{|}}{CH}—C_nH_{2n+1}$$

I:

$$—O—C_mH_{2m}-\underset{\underset{CCl_3}{|}}{CH}—C_nH_{2n+1}$$

J:

$$—S—C_mH_{2m}-\underset{\underset{Cl}{|}}{CH}—C_nH_{2n+1}$$

K:

$$—O—C_mH_{2m}-\underset{\underset{F}{|}}{CH}—C_nH_{2n+1}$$

L:

—$O—C_mH_{2m}-C_nF_{2n+1}$

M:

$$—S—C_mH_{2m}-\underset{\underset{CF_3}{|}}{CH}—C_nH_{2n+1}$$

N:

—$S—C_mH_{2m}-C_nF_{2n+1}$

O:

—$C_2H_4—O—C_nH_{2n+1}$

TABLE 1

| | | | R | | |
|---|---|---|---|---|---|
| Compound No. | Metal M | Group Bonded to Metal M | Side-Chain symbol | n | m |
| 1 | Pt | none | A | 5 | |
| 2 | Pt | none | A | 10 | |

TABLE 1-continued

| | | | R | | |
|---|---|---|---|---|---|
| Compound No. | Metal M | Group Bonded to Metal M | Side-Chain symbol | n | m |
| 3 | Pt | none | A | 15 | |
| 4 | Pt | none | A | 20 | |
| 5 | Pt | none | B | 5 | |
| 6 | Pt | none | B | 10 | |
| 7 | Pt | none | B | 15 | |
| 8 | Pt | none | B | 20 | |
| 9 | Pt | none | C | 8 | |
| 10 | Pt | none | C | 10 | |
| 11 | Pt | none | D | 7 | |
| 12 | Pt | none | D | 11 | |
| 13 | Pt | none | E | 7 | |
| 14 | Pt | none | E | 19 | |
| 15 | Pt | none | F | 7 | |
| 16 | Pt | none | F | 15 | |
| 17 | Pt | none | G | 7 | |

TABLE 2

| | | | R | | |
|---|---|---|---|---|---|
| Compound No. | Metal M | Group Bonded to Metal M | Side-Chain symbol | n | m |
| 18 | Pt | none | G | 11 | |
| 19 | Pt | none | H | 5 | 1 |
| 20 | Pt | none | H | 10 | 3 |
| 21 | Pt | none | H | 13 | 5 |
| 22 | Pt | none | I | 7 | 3 |
| 23 | Pt | none | I | 11 | 5 |
| 24 | Pt | none | J | 7 | 3 |
| 25 | Pt | none | J | 11 | 5 |
| 26 | Pt | none | K | 7 | 5 |
| 27 | Pt | none | K | 14 | 5 |
| 28 | Pt | none | L | 3 | 1 |
| 29 | Pt | none | L | 5 | 3 |
| 30 | Pt | none | L | 10 | 5 |
| 31 | Pt | none | M | 5 | 3 |
| 32 | Pt | none | M | 10 | 3 |
| 33 | Pt | none | M | 15 | 3 |
| 34 | Pt | none | N | 5 | 3 |

TABLE 3

| | | | R | | |
|---|---|---|---|---|---|
| Compound No. | Metal M | Group Bonded to Metal M | Side-Chain symbol | n | m |
| 35 | Pt | none | N | 10 | 3 |
| 36 | Pt | none | N | 15 | 3 |
| 37 | Pd | none | A | 5 | |
| 38 | Pd | none | A | 10 | |
| 39 | Pd | none | A | 15 | |
| 40 | Pd | none | A | 20 | |
| 41 | Pd | none | B | 5 | |
| 42 | Pd | none | B | 10 | |
| 43 | Pd | none | B | 15 | |
| 44 | Pd | none | B | 20 | |
| 45 | Pd | none | C | 8 | |
| 46 | Pd | none | C | 10 | |
| 47 | Pd | none | D | 7 | |
| 48 | Pd | none | D | 11 | |
| 49 | Pd | none | E | 7 | |
| 50 | Pd | none | E | 19 | |
| 51 | Pd | none | F | 7 | |

TABLE 4

| Compound No. | Metal M | Group Bonded to Metal M | R Side-Chain symbol | n | m |
|---|---|---|---|---|---|
| 52 | Pd | none | F | 15 | |
| 53 | Pd | none | G | 7 | |
| 54 | Pd | none | G | 11 | |
| 55 | Pd | none | H | 5 | 1 |
| 56 | Pd | none | H | 10 | 3 |
| 57 | Pd | none | H | 13 | 5 |
| 58 | Pd | none | I | 7 | 3 |
| 59 | Pd | none | I | 11 | 5 |
| 60 | Pd | none | J | 7 | 3 |
| 61 | Pd | none | J | 11 | 5 |
| 62 | Pd | none | K | 7 | 5 |
| 63 | Pd | none | K | 14 | 5 |
| 64 | Pd | none | L | 3 | 1 |
| 65 | Pd | none | L | 5 | 3 |
| 66 | Pd | none | L | 10 | 5 |
| 67 | Pd | none | M | 5 | 3 |
| 68 | Pd | none | M | 10 | 3 |

TABLE 5

| Compound No. | Metal M | Group Bonded to Metal M | R Side-Chain symbol | n | m |
|---|---|---|---|---|---|
| 69 | Pd | none | M | 15 | 3 |
| 70 | Pd | none | N | 5 | 3 |
| 71 | Pd | none | N | 10 | 3 |
| 72 | Pd | none | N | 15 | 3 |
| 73 | Cu | none | A | 5 | |
| 74 | Cu | none | A | 10 | |
| 75 | Cu | none | A | 15 | |
| 76 | Cu | none | A | 20 | |
| 77 | Cu | none | B | 5 | |
| 78 | Cu | none | B | 10 | |
| 79 | Cu | none | B | 15 | |
| 80 | Cu | none | B | 20 | |
| 81 | Cu | none | C | 8 | |
| 82 | Cu | none | C | 10 | |
| 83 | Cu | none | D | 7 | |
| 84 | Cu | none | D | 11 | |
| 85 | Cu | none | E | 7 | |

TABLE 6

| Compound No. | Metal M | Group Bonded to Metal M | R Side-Chain symbol | n | m |
|---|---|---|---|---|---|
| 86 | Cu | none | E | 19 | |
| 87 | Cu | none | F | 7 | |
| 88 | Cu | none | F | 15 | |
| 89 | Cu | none | G | 7 | |
| 90 | Cu | none | G | 11 | |
| 91 | Cu | none | H | 5 | 1 |
| 92 | Cu | none | H | 10 | 3 |
| 93 | Cu | none | H | 13 | 5 |
| 94 | Cu | none | I | 7 | 3 |
| 95 | Cu | none | I | 11 | 5 |
| 96 | Cu | none | J | 7 | 3 |
| 97 | Cu | none | J | 11 | 5 |
| 98 | Cu | none | K | 7 | 5 |
| 99 | Cu | none | K | 14 | 5 |
| 100 | Cu | none | L | 3 | 1 |
| 101 | Cu | none | L | 5 | 3 |
| 102 | Cu | none | L | 10 | 5 |

TABLE 7

| Compound No. | Metal M | Group Bonded to Metal M | R Side-Chain symbol | n | m |
|---|---|---|---|---|---|
| 103 | Cu | none | M | 5 | 3 |
| 104 | Cu | none | M | 10 | 3 |
| 105 | Cu | none | M | 15 | 3 |
| 106 | Cu | none | N | 5 | 3 |
| 107 | Cu | none | N | 10 | 3 |
| 108 | Cu | none | N | 15 | 3 |
| 109 | Co | none | A | 10 | |
| 110 | Co | none | A | 15 | |
| 111 | Co | none | B | 10 | |
| 112 | Co | none | B | 15 | |
| 113 | Co | none | C | 10 | |
| 114 | Co | none | D | 11 | |
| 115 | Co | none | E | 7 | |
| 116 | Co | none | F | 7 | |
| 117 | Co | none | G | 11 | |
| 118 | Co | none | H | 10 | 3 |
| 119 | Co | none | I | 11 | 3 |

TABLE 8

| Compound No. | Metal M | Group Bonded to Metal M | R Side-Chain symbol | n | m |
|---|---|---|---|---|---|
| 120 | Co | none | J | 11 | 3 |
| 121 | Co | none | K | 14 | 3 |
| 122 | Co | none | L | 5 | 3 |
| 123 | Co | none | L | 10 | 3 |
| 124 | Co | none | M | 10 | 3 |
| 125 | Co | none | N | 10 | 3 |
| 126 | Ru | Co | A | 10 | |
| 127 | Ru | Co | A | 15 | |
| 128 | Ru | Co | B | 10 | |
| 129 | Ru | Co | B | 15 | |
| 130 | Ru | Co | C | 10 | |
| 131 | Ru | Co | D | 11 | |
| 132 | Ru | Co | E | 7 | |
| 133 | Ru | Co | F | 7 | |
| 134 | Ru | Co | G | 11 | |
| 135 | Ru | Co | H | 10 | 3 |
| 136 | Ru | Co | I | 11 | 3 |

TABLE 9

| Compound No. | Metal M | Group Bonded to Metal M | R Side-Chain symbol | n | m |
|---|---|---|---|---|---|
| 137 | Ru | Co | J | 11 | 3 |
| 138 | Ru | Co | K | 14 | 3 |
| 139 | Ru | Co | L | 5 | 3 |
| 140 | Ru | Co | L | 10 | 3 |
| 141 | Ru | Co | M | 10 | 3 |
| 142 | Ru | Co | N | 10 | 3 |
| 143 | Ir | Cl | A | 10 | |
| 144 | Ir | Cl | A | 15 | |
| 145 | Ir | Cl | B | 10 | |
| 146 | Ir | Cl | B | 15 | |
| 147 | Ir | Cl | C | 10 | |
| 148 | Ir | Cl | D | 11 | |
| 149 | Ir | Cl | E | 7 | |
| 150 | Ir | Cl | F | 7 | |
| 151 | Ir | Cl | G | 11 | |
| 152 | Ir | Cl | H | 10 | 3 |
| 153 | Ir | Cl | I | 11 | 3 |

TABLE 10

| Compound No. | Metal M | Group Bonded to Metal M | R Side-Chain symbol | n | m |
|---|---|---|---|---|---|
| 154 | Ir | Cl | J | 11 | 3 |
| 155 | Ir | Cl | K | 14 | 3 |
| 156 | Ir | Cl | L | 5 | 3 |
| 157 | Ir | Cl | L | 10 | 3 |
| 158 | Ir | Cl | M | 10 | 3 |
| 159 | Ir | Cl | N | 10 | 3 |
| 160 | Au | Cl | A | 10 | |
| 161 | Au | Cl | A | 15 | |
| 162 | Au | Cl | B | 10 | |
| 163 | Au | Cl | B | 15 | |
| 164 | Au | Cl | C | 10 | |
| 165 | Au | Cl | D | 11 | |
| 166 | Au | Cl | E | 7 | |
| 167 | Au | Cl | F | 7 | |
| 168 | Au | Cl | G | 11 | |
| 169 | Au | Cl | H | 10 | 3 |
| 170 | Au | Cl | I | 11 | 3 |

TABLE 11

| Compound No. | Metal M | Group Bonded to Metal M | R Side-chain symbol | n | m |
|---|---|---|---|---|---|
| 171 | Au | Cl | J | 11 | 3 |
| 172 | Au | Cl | K | 14 | 3 |
| 173 | Au | Cl | L | 5 | 3 |
| 174 | Au | Cl | L | 10 | 3 |
| 175 | Au | Cl | M | 10 | 3 |
| 176 | Au | Cl | N | 10 | 3 |
| 177 | Rh | Cl | A | 10 | |
| 178 | Rh | Cl | A | 15 | |
| 179 | Rh | Cl | B | 10 | |
| 180 | Rh | Cl | B | 15 | |
| 181 | Rh | Cl | C | 10 | |
| 182 | Rh | Cl | D | 11 | |
| 183 | Rh | Cl | E | 7 | |
| 184 | Rh | Cl | F | 7 | |
| 185 | Rh | Cl | G | 11 | |
| 186 | Rh | Cl | H | 10 | 3 |
| 187 | Rh | Cl | I | 11 | 3 |

TABLE 12

| Compound No. | Metal M | Group Bonded to Metal M | R Side-chain symbol | n | m |
|---|---|---|---|---|---|
| 188 | Rh | Cl | J | 11 | 3 |
| 189 | Rh | Cl | K | 14 | 3 |
| 190 | Rh | Cl | L | 5 | 3 |
| 191 | Rh | Cl | L | 10 | 3 |
| 192 | Rh | Cl | M | 10 | 3 |
| 193 | Rh | Cl | N | 10 | 3 |

TABLE 13

| Compound No. | R' of Formula (2) Side-chain symbol | n | m |
|---|---|---|---|
| 194 | B | 10 | |
| 195 | B | 5 | |
| 196 | L | 3 | 7 |

TABLE 14

| Compound No. | Metal M | Group Bonded to Metal M | R Side-chain symbol | n | m |
|---|---|---|---|---|---|
| 197 | Pt | none | O | 6 | |
| 198 | Pt | none | O | 8 | |
| 199 | Pt | none | O | 10 | |
| 200 | Cu | none | O | 6 | |
| 201 | Cu | none | O | 8 | |
| 202 | Cu | none | O | 10 | |
| 203 | Pd | none | O | 6 | |
| 204 | Pd | none | O | 8 | |
| 205 | Pd | none | O | 10 | |

When the light emitting layer is comprised of a carrier-transporting host material and a phosphorescent light emitting guest, in the chief process of coming to emit phosphorescent light through the triplet excitons, desired energy transfer and light emission in each process take place in competition with various deactivation steps.

In order to enhance the light emission efficiency of EL devices, needless to say, the quantum yield of light emission of the light emission center material itself must be large. However, the question of how efficiently the host-to-host or host-to-guest of energy transfer can be effected becomes a big issue. In addition, in order to enhance emission luminance, it is very effective to enhance the injection of electric charges generated by electrification, and a measure therefor must also be taken.

The state of a minimum excitation of light emitting materials used in phosphorescent light emitting devices is considered to be the state of MLCT* (metal-to-ligand charge transfer) excitation or the state of $\pi$–$\pi$* excitation in the triplet state. The phosphorescent light emission takes place when the material undergoes a transition from these states into the ground state. In general, in the phosphorescent light emission, the material stays in the above state of excitation for a longer time than in the fluorescent light emission, and molecules in an excited state tend to exchange energy with surrounding molecules to lose energy. In particular, there is also a phenomenon that the light emission intensity of the device decreases with an increase in concentration in which the light emitting material is incorporated into a light emitting layer. This phenomenon is known as concentration quenching (quenching ascribable to concentration), and it is considered that energy is transferred from molecules in an excited state to surrounding molecules and the molecules which were in an excited state come not to emit light by themselves.

The group of porphyrin derivative compounds used in the present invention can emit light with high intensity, i.e., can emit fluorescent light or, in the case of a compound containing a heavy metal, phosphorescent light. In particular, the difference from conventional compounds is in that the alkyl group represented by R in Formula (1) or (2) has a long side chain (the number of carbon atoms in R is 5 or more and 20 or less), hence the intermolecular distance between adjoining light emitting molecules becomes longer, so that they are kept from acting mutually, as so considered. Thus, the material can be kept from causing the concentration quenching, hence can be mixed in a high concentration with respect to the host, so that the device can be made to have a high light emission intensity.

Because of its long side chain, the material also has an improved solubility in solvents. This enables the layer of the material to be easily formed by spin coating or the like. In addition, when the layer is formed by vacuum co-deposition, compositional uniformity can also be improved.

When used as a light emitting material of phosphorescent light emitting devices, the porphyrin derivative compound in the present invention may be dispersed in a host material, or it may be used at 100% without any host material to form a layer.

As described later, the porphyrin derivative compound may also be used to form a charge injection layer of the light emitting device. In such a case, the compound may be present thinly in the vicinity of electrode interface, and such a thinness may also bring about the effect of improving conductivity.

Where the porphyrin derivative compound in the present invention is used in the form of a mixture with other materials, it may be mixed in an amount of 50 weight % or less, and preferably in the range from 0.1 to 20 weight %. Its use in an amount larger than 50 weight % is not preferable because the concentration quenching may occur, resulting in a low light emission intensity.

As described above, the porphyrin derivative compound used in the present invention has a long side chain. Hence, the porphyrin hardly undergoes any intermolecular interaction with each other, and hardly causes any concentration quenching. Thus, a light emitting device having high luminance and high efficiency can be obtained.

The porphyrin derivative compound used in the present invention can also exhibit a liquid crystal phase. In such a case, the carrier can be transported at a high mobility by virtue of a liquid crystal molecular arrangement. Hence, the compound is also suited for a carrier transport layer. Also, it has been found that this compound can improve carrier injection performance, in particular, hole injection performance, as compared with conventional materials.

In a common organic EL device construction, e.g., in a device of ITO electrode/hole transport layer/light emitting layer/electron transport layer/negative electrode construction, a device is made up in which the porphyrin derivative compound is formed into a film 1 to 10 nm in thickness between the ITO electrode and the hole transport layer. The value of electric current when a voltage is applied to this device becomes at least twice as large as when the porphyrin derivative compound is not used.

In the case when this porphyrin derivative compound has a liquid crystal phase, its use at the liquid-crystal-phase temperature brings about the effect of improving the value of electric current by about 10 times to 20 times. This is a phenomenon which is effective where the porphyrin derivative compound layer has such a very small thickness (1 to 10 nm). Hence, this is understood to be not an improvement in charge mobility in the porphyrin derivative compound layer but an improvement in the performance of hole injection from the ITO electrode into the organic layers.

The reason for this improvement is considered as follows. The porphyrin derivative compound having a long side-chain alkyl group has discotic liquid crystal properties, and the porphyrin rings can be oriented parallel, or substantially parallel, to the ITO interface of the electrode. Hence, the porphyrin rings rich in π-electrons come close to the ITO plane over a large area, where the holes are abundantly injected thereinto from the ITO electrode. Where the compound not only has a long carbon side-chain but also further has liquid crystal properties, it can structurally have flexibility and adaptability, and hence more remarkably comes into close contact with the ITO, bringing about more improvement in hole injection performance, as so considered.

This effect of improvement achievable at a liquid-crystal-phase temperature can also be maintained even at a temperature lower than the liquid-crystal-phase temperature. Hence, it is considered that the structure of the liquid crystal molecular arrangement is also maintained at the temperature lower than the liquid-crystal-phase temperature. Accordingly, the porphyrin derivative compound used in the present invention having both the high-intensity light emission and the high carrier transport performance can be said to be a material most suited as a constituent material at various locations of light emitting devices.

The high-efficiency light emitting device shown in the present invention can be applied to products required to be energy-saving and have a high luminance. As examples of the application, light sources of display units, lighting fixtures and printers, back lights of liquid crystal display units, etc. may be given. As the display units, energy saving and highly viewable and light-weight flat panel display can be realized.

In the application to specific display units, systems may be exemplified which employ active-matrix drive making use of thin film transistors (hereinafter simply "TFT").

An example in which an active-matrix substrate is used in the display unit of the present invention is briefly described with reference to FIG. 2.

Figure 2:
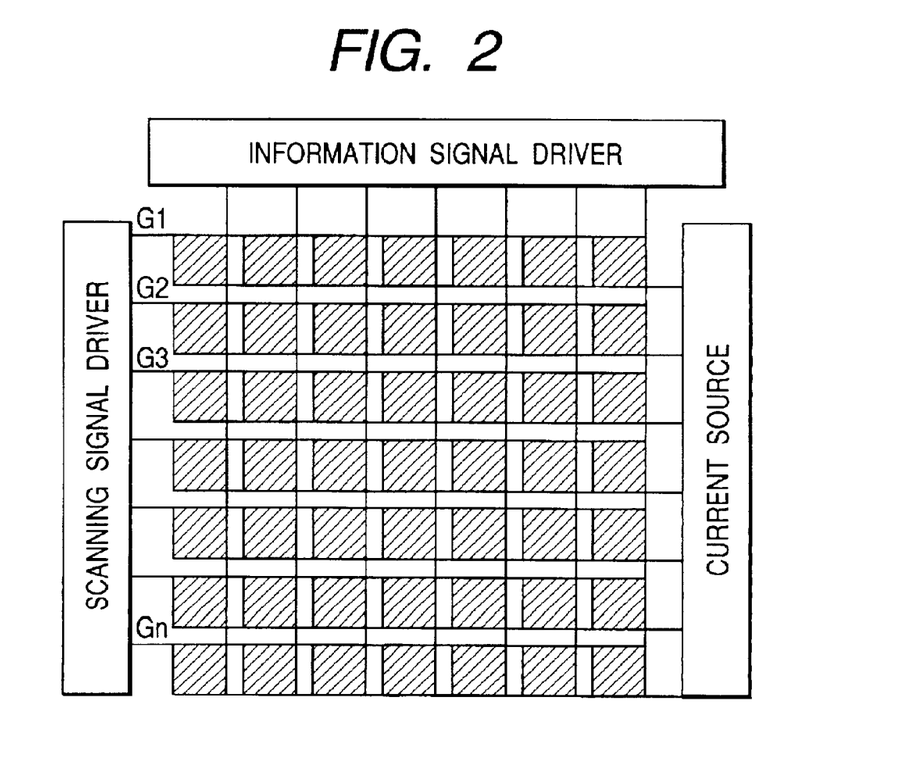
FIG. 2 is a diagrammatic view showing the construction of a form in which the light emitting device of the present invention is provided with a drive means.

FIG. 2 is a diagrammatic illustration of the construction in which the light emitting device of the present invention is provided with a drive means. In the panel, a scanning signal driver, an information signal driver and a current source are arranged and connected to a gate scanning line, an information line and a current line, respectively. At the point of intersection of the gate scanning line and the information line, a pixel circuit shown in FIG. 3A or 3B is provided. The scanning signal driver selects gate scanning lines G1, G2, G3, . . . and Gn sequentially, and in synchronization therewith image signals are imparted from the information signal driver. Thus, the desired image can be displayed. On each pixel electrode, the light emitting material can continue emitting light throughout the duration of one horizontal scanning, and a device can be obtained with a brighter display than simple-matrix drive systems.

EXAMPLES

The present invention is described below in greater detail by giving Examples.

Examples 1 and 2

Synthesis examples of exemplary compounds No. 6 and No. 194 are shown below.

$C_2H_5OOCCH_2NHCH_2COOC_2H_5 \longrightarrow$

Into a 5-L three-necked flask, 523.2 g (2.765 moles) of diethyl iminodiacetate, 465.4 g (5.540 moles) of sodium hydrogencarbonate and 1.4L of DMF (dimethylformamide) were put, and, keeping the mixture at about 40° C., 473.5 g (2.768 moles) of benzyl bromide was slowly dropwise added thereto with stirring. Thereafter, the mixture was stirred at about 40° C. for 16 hours. After the reaction was completed, 1.5L of water was added to the reaction product, which was then extracted with toluene (500 ml×four times). The organic layer formed was washed with water and dried with Glauber's salt. Thereafter, the solvent was evaporated to dryness to obtain 780 g of diethyl N-benzyliminodiacetate (yield: 98.8%).

C₂H₅OOCCH₂NCH₂COOC₂H₅
|
CH₂—C₆H₅

Into a 20L three-necked flask, 2.7L of ethanol was put, and 139.2 g (6.05 moles) of small cuts of metallic sodium were gradually added thereto with stirring at room temperature. After the addition was completed, the mixture was stirred under reflux until the metallic sodium became dissolved completely. The mixture formed was cooled to room temperature, and 770.7 g (2.760 moles) of the diethyl N-benzyliminodiacetate and 405.8 g (2.775 moles) of diethyl oxalate were added thereto, which were then stirred under reflux for 8 hours. After the reaction was completed, the reaction product was left to cool, and its pH was adjusted to 5.5 by adding 4.5L of acetic acid. The precipitate formed was collected by filtration and washed with water. This precipitate was washed with acetone to obtain 532.8 g of diethyl N-benzyl-3,4-dihydroxypyrrole-2,5-dicarboxylate (yield: 57.9%), having a melting point of 143.5 to 145.0° C.

Into a 20-L three-necked flask, 224.4 g (0.673 mole) of the diethyl-benzyl-3,4-dihydroxypyrrole-2, 5-dicarboxylate, 470.1 g (3.402 moles) of sodium carbonate and 4.5L of DMF were put, and 446.6 g (2.109 moles) of 1-bromodecane were dropwise added thereto with stirring at room temperature. After the addition was completed, the reaction mixture was gradually heated to 85° C., and heated and stirred at about 85° C. for 2 hours. After the reaction was completed, the reaction product was left standing overnight at room temperature, and then poured into 1.5L of water. This was extracted with toluene, and the organic layer formed was washed with water and dried with Glauber's salt. Thereafter, the solvent was evaporated to dryness. The residue formed was purified by silica gel column chromatography using toluene as an eluent, to obtain 395.3 g of a pale-yellow liquid of diethyl N-benzyl-3, 4-didecyloxypyrrole-2,5-dicarboxylate (yield: 95.7%).

Into a 1-L autoclave, 121.1 g (0.197 mole) of the diethyl N-benzyl-3,4-didecyloxypyrrole-2, 5-dicarboxylate, 600 ml of acetic acid and 12.0 g of 10% palladium-carbon were put, and the reaction was carried out for 84 hours at 30° C. and a hydrogen pressure of 1.8×10⁶ Pa. After the reaction was completed, the 10% palladium-carbon was removed by filtration, and the filtrate formed was evaporated to dryness. The residue formed was purified by silica gel column chromatography (eluent: toluene/acetic acid=5/1) to obtain 78.3 g of diethyl 3,4-didecyloxypyrrole-2,5-dicarboxylate (yield: 75.8%).

Into a 3-L three-necked flask, 68.6 g (131 mmoles) of the diethyl 3,4-didecyloxypyrrole-2,5-dicarboxylate and 680 ml of ethanol were put, and an aqueous sodium hydroxide solution (prepared by dissolving 52.4 g of sodium hydroxide in 655 ml of water) was dropwise added thereto over a period of 15 minutes with stirring at room temperature. Thereafter, the mixture was heated and stirred at about 60° C. for 6.5 hours. After the reaction was completed, the reaction product was cooled to room temperature, and the sodium carboxylate thus deposited was collected by filtration, followed by washing with ethanol. The resultant crystals were dispersed in a solution of a mixture of 3L of ethyl acetate and 350 ml of water, and 91 ml of 3N-hydrochloric acid was added to adjust the pH to about 1. The organic layer formed was washed with water and dried with Glauber's salt. Thereafter, the solvent was evaporated to dryness. The residue formed was recrystallized with an ethyl acetate/hexane mixed solvent to obtain 40.3 g of white crystals of 3,4-didecyloxypyrrole-2,5-dicarboxylic acid (yield: 65.8%).

Into a 300-ml three-necked flask, 100 ml of triethanolamine was put, and was heated to 180° C. and stirred. Then, 23.4 g (50.0 mmoles) of the 3,4-didecyloxypyrrole-2,5-dicarboxylic acid was added thereto at one time. The mixture was vigorously stirred until carbon dioxide stopped being generated. The reaction product formed was cooled (for about 5 minutes) to room temperature, and 200 ml of water was added thereto, followed by extraction with chloroform. The organic layer formed was dried with magnesium sulfate, and the solvent was evaporated to dryness. The residue was purified by silica gel column chromatography (eluent: chloroform/hexane=2/1) to obtain 17.2 g of 3,4-didecyloxypyrrole (yield: 90.7%).

Under conditions of light screening, 13.8 g (36.4 mmoles) of the 3,4-didecyloxypyrrole, 1.74 g (43.6 mmoles) of paraformaldehyde, 0.138 g (0.73 mmole) of p-toluenesulfonic acid and 1.1L of anhydrous toluene were put into a 2-L three-necked flask, which were then heated and stirred at 60° C. for 24 hours. After the reaction was completed, the reaction product was cooled to room temperature, and the solvent was evaporated to dryness. The residue formed was purified by silica gel column chromatography (eluent: chloroform/hexane=2/1) to obtain 2.00 g of dark-red powder of 2,3,7,8,12,13,17,18-octadecyloxyporphyrin (yield: 14.1%).

Into a 200-ml three-necked flask, 55 ml of benzonitrile, 0.28 g (1.07 mmoles) of $PtCl_2$ and 1.11 g (0.711 mmole) of the 2,3,7,8,12,13,17,18-octadecyloxyporphyrin were put, and were heated and stirred at an internal temperature of 160° C. for 14 hours. After the reaction was completed, the reaction product was cooled to room temperature, and the benzonitrile was evaporated under reduced pressure. The residue formed was purified by silica gel column chromatography (eluent: chloroform/hexane=1/1) to obtain 0.92 g of orange crystals of 2,3,7,8,12,13,17,18-octadecyloxyporphyrin platinum complex (yield: 73.8%).

This 2,3,7,8,12,13,17,18-octadecyloxyporphyrin platinum complex was dissolved in a toluene solution in a concentration of $1\times10^{-5}M$, and then excited with excitation light at room temperature to examine photoluminescence, where red light having a maximum wavelength at 660 nm was ascertained. The emission lifetime of this light emission was measured, where it had a lifetime of 10 $\mu$sec. or more, and it was ascertained therefrom that this light emission was phosphorescence.

Its phase transition temperature was also examined with a differential scanning calorimeter (DSC) to obtain the following results.

Cryst→61° C.→Dh→127° C.→Iso
Cryst: Crystal phase
Dh: Discotic hexagonal phase
Iso: Isotropic phase This compound was injected into a liquid crystal cell of 2μ in cell thickness, coated with an ITO film of 1,000 Å thick, and this cell was held beneath a polarizing microscope set under crossed nicol for observation. As a result, a texture extending in six directions, peculiar to the Dh phase was seen.

This cell was heated to 130° C. and then cooled slowly (0.5° C./min.) to effect re-orientation. As a result, homeotropic orientation in which the greater part of its visual field was in dark field was ascertained.

A voltage of ±30 V was applied to this cell and the electric current values at liquid crystal temperature and at crystal temperature were compared with each other. It was found that the difference between them is 5 times or more, ascertaining a high conductivity resulting from the liquid crystal molecular orientation.

Example 3

An example in which the porphyrin derivative compound is used in a light emitting device as a liquid crystal material of the present invention is shown below.

Figure 1:
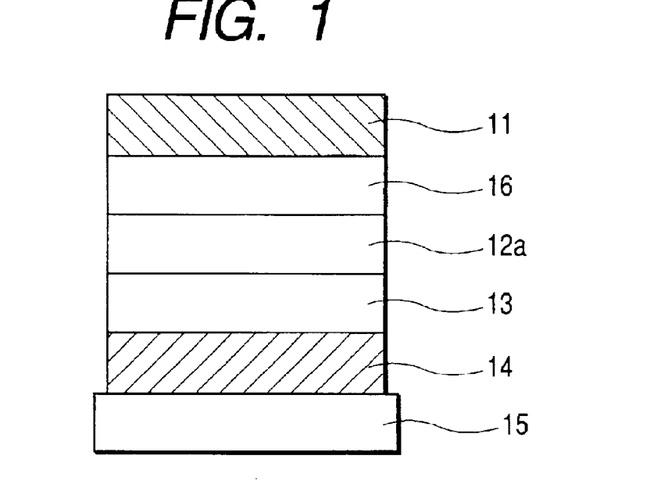
FIG. 1 is a sectional view showing an example of the light emitting device of the present invention.

A device having three organic layers as shown in FIG. 1 was used. On a glass substrate, ITO was patterned in 100 nm thickness to have an opposing electrode area of 3 mm$^2$, providing the transparent electrode 14. On this ITO electrode, the following organic layers and electrode layers were formed successively by vacuum deposition in a vacuum chamber at 10$^{-4}$ Pa, utilizing resistance heating.
Organic layer 1 (hole transport layer 13) (40 nm thick): α-NPD.
Organic layer 2 (light emitting layer 12a) (30 nm thick): CBP+2,3,7,8,12,13,17,18-octadecyloxy-porphyrin platinum complex (weight ratio: complex 5 weight %).
Organic layer 3 (electron transport layer 16) (30 nm thick): Alq3.
Metal electrode layer 1 (15 nm thick): AlLi alloy (Li content: 1.8 weight %).
Metal electrode layer 2 (100 nm thick): Al.

Setting the ITO side as an anode and the Al side as a cathode, an electric field was applied to measure current-voltage characteristics and emission luminance.

Current-voltage characteristics good in rectification were obtained, and light emission with the same maximum wavelength at 660 nm as the photoluminescence in solution of Example 1 was obtained.

In order to determine concentration quenching characteristics, the above compound (complex) was dispersed in CBP at a concentration ranging from 5 to 20%, and the light emission efficiency of the device was determined. As a result, it showed characteristics having the maximum at a concentration of about 10%. This value indicates a higher concentration than PtOEP disclosed in the publication, and can be considered to have been brought out because of the longer alkyl group. Thus, the above compound can provide a device having a higher emission luminance than can PtOEP.

Example 4

This example is the same as Example 3 except that the light emitting material of the organic layer 2 in Example 3 was changed as shown below.
Organic layer 2 (light emitting layer 12a) (30 nm thick): CBP+2,3,7,8,12,13,17,18-octadecyloxy-porphyrin (weight ratio: porphyrin 5 weight %).

Setting the ITO side as an anode and the Al side as a cathode, an electric field was applied to measure current-voltage characteristics and emission luminance.

Current-voltage characteristics good in rectification were obtained, and light emission with a maximum wavelength at 660 nm due to the porphyrin compound was obtained.

It was also ascertained that the lifetime of this light emission was 50 μsec. or less, and was found to be fluorescence.

Example 5

In Example 3, as a metal coordination compound used in the organic layer 2, Ir(ppy)$_3$ shown below was used.

Ir (ppy) 3

Between the organic layer 1 and the ITO, the 2,3,7,8,12,13,17,18-octadecyloxyporphyrin platinum complex synthesized in Example 1 was layered in a thickness of 10 nm.

Device construction thus made up was as follows:
ITO layer.
Organic layer (10 nm thick): 2,3,7,8,12,13,17,18-octadecyloxyporphyrin platinum complex.
Organic layer 1 (40 nm thick): α-NPD.
Organic layer 2 (30 nm thick): CBP+Ir(ppy)$_3$ (weight ratio: 5 weight %).
Organic layer 3 (30 nm thick): Alq3.
Metal electrode layer 1 (15 nm thick): AlLi alloy (Li content: 1.8 weight %).
Metal electrode layer 2 (100 nm thick): Al.

Setting the ITO side as an anode and the Al side as a cathode, an electric field was applied to measure current-voltage characteristics and emission luminance.

Current-voltage characteristics good in rectification were obtained, and light emission with a maximum wavelength at 510 nm due to Ir(ppy)$_3$ was obtained. In this Example, the values of electric current and the luminance were about three times those of a device having no platinum complex layer, and it was ascertained that the platinum complex of this Example had good properties for both carrier injection and carrier transport.

Like characteristics were obtained also when the porphyrin platinum complex layer was formed by spin coating of a chloroform solution of the platinum complex, followed by the same steps as the above steps to produce a device. The values of electric current and the luminance in this case were about 3.5 times those of the device having no platinum complex layer.

Figure 5:
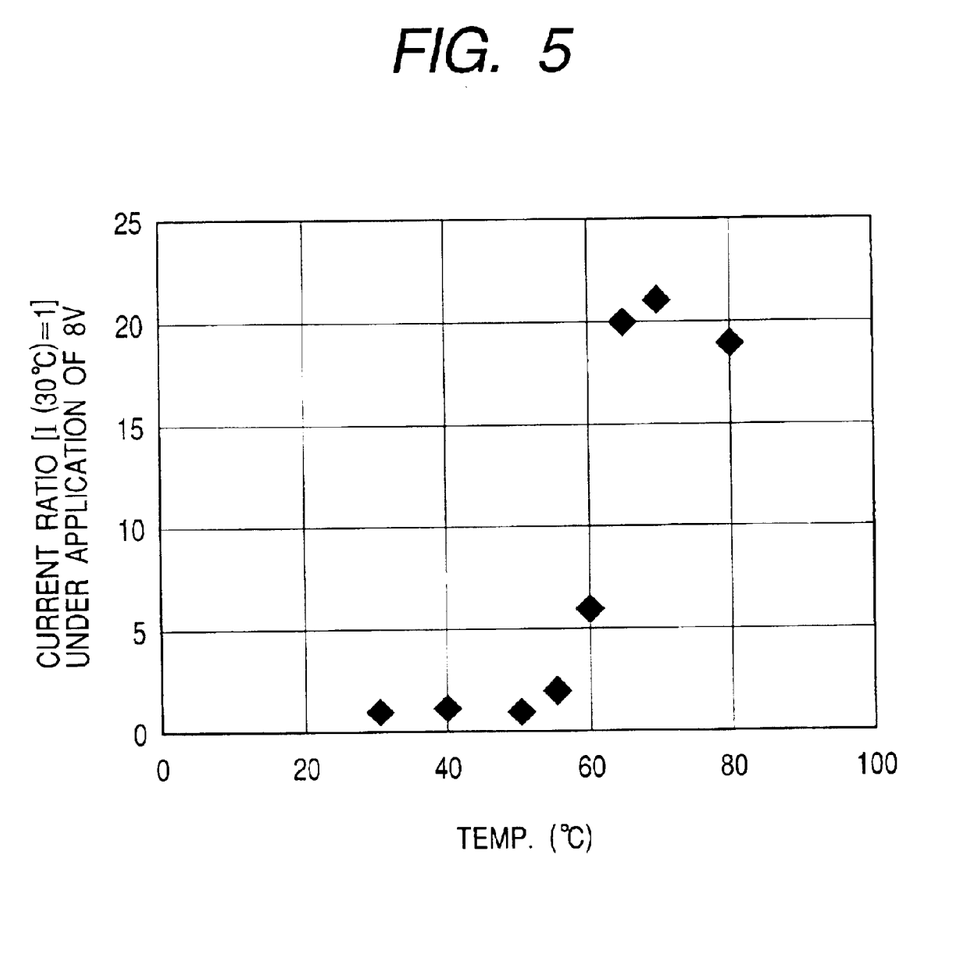
FIG. 5 is a graph showing changes in the value of electric current at a liquid-crystal-phase temperature of a porphyrin platinum complex layer.

The level of electric current flowing through the device was measured, changing the device temperature. The ratio of the value of electric current to the value of electric current at 30° C. regarded as a reference (i.e., current ratio) is shown in FIG. 5. A constant voltage (8 V) was applied across the device electrodes, and the device temperature was raised to 80° C., which was higher than the isotropic phase temperature of the porphyrin platinum complex, and the value of electric current of the device was measured. It was seen that the value of electric current increased abruptly at about 61° C. at which this compound showed phase transition to a liquid crystal. Also, the electric-current improvement effect at 80° C. was retained also when the device thus temperature-raised was restored again to 30° C., and the current ratio was 18 even at 30° C. with respect to the value of 19 at 80° C. This can be considered to be an effect due to the fact that the above compound having come into an isotropic phase turned into a discotic liquid crystal phase with a lowering of the temperature and charge injection performance and charge mobility were improved.

Example 6

Using the substrate with a TFT circuit shown in FIG. 2, a color organic EL display was produced. In the region corresponding to each color pixel, organic layers and metal layers were formed by vacuum deposition using a hard mask to effect patterning. The construction of organic layers corresponding to each color pixel was as follows:

Green pixel:
α-NDP (50 nm)/Alq (50 nm).
Blue pixel:
α-NDP (50 nm)/BCP (20 nm)/Alq (50 nm).
Red pixel:
α-NDP (40 nm)/CBP+the platinum complex in Example 1 (30 nm)/BCP (20 nm)/Alq (50 nm).

The number of pixels was 128×128. It was confirmed that the desired image information was able to be displayed, and it was found that good, stable images were displayed.

Example 7

The following copper porphyrin compound was synthesized according to the method disclosed by Brian A. Gregg et al. (Journal of American Chemical Society 1989, 111, pp.3024–3029).

This Example is the same as Example 5 except that the 2,3,7,8,12,13,17,18-octadecyloxyporphyrin platinum complex was changed to the following 2,3,7,8,12,13,17,18-octaoctyloxyethylporphyrin copper complex.

Device construction thus made up was as follows:
ITO layer.
Organic layer (6 nm thick): 2,3,7,8,12,13,17,18-octaoctyloxyethylporphyrin copper complex.
Organic layer 1 (40 nm thick): π-NPD.
Organic layer 2 (30 nm thick): CBP+Ir(ppy)$_3$ (weight ratio: 5 weight %).
Organic layer 3 (30 nm thick): Alq3.
Metal electrode layer 1 (15 nm thick): AlLi alloy (Li content: 1.8 weight %).
Metal electrode layer 2 (100 nm thick): Al.

Setting the ITO side as an anode and the Al side as a cathode, an electric field was applied to measure current-voltage characteristics and emission luminance, where current-voltage characteristics good in rectification were obtained, and light emission with a maximum wavelength at 510 nm due to Ir(ppy)$_3$ was obtained. In this Example, the value of the electric current and the luminance were about 1.8 times those of a device not having the copper complex layer, and it was ascertained that the copper complex of this Example had good properties for both carrier injection and carrier transport. In addition, since the octaoctyloxyethylporphyrin copper complex is thinly formed in a layer thickness of 6 nm, the presence of this layer is considered to improve the hole injection performance at the electrode interface.

Example 8

The following palladium porphyrin compound was synthesized in the same manner as the compound in Example 7 according to the above publication.

This Example is the same as Example 5 except that the 2,3,7,8,12,13,17,18-octadecyloxyporphyrin platinum complex was changed to the following 2,3,7,8,12,13,17,18-octaoctyloxyethylporphyrin palladium complex.

Device construction thus made up was as follows:
ITO layer.
Organic layer (5 nm thick): 2,3,7,8,12,13,17,18-octaoctyloxyethylporphyrin palladium complex.
Organic layer 1 (40 nm thick): α-NPD.
Organic layer 2 (30 nm thick): CBP+Ir(ppy)$_3$ (weight ratio: 5 weight %).
Organic layer 3 (30 nm thick): Alq3.
Metal electrode layer 1 (15 nm thick): AlLi alloy (Li content: 1.8 weight %).
Metal electrode layer 2 (100 nm thick): Al.

Setting the ITO side as an anode and the Al side as a cathode, an electric field was applied to measure current-voltage characteristics and emission luminance, where current-voltage characteristics good in rectification were obtained, and light emission with a maximum wavelength at 510 nm due to the Ir(ppy)$_3$ was obtained. In this Example, the value of electric current and the luminance were about 2.2 times those of a device not having the palladium complex layer at room temperature (25° C.), and it was ascertained that the palladium complex of this Example had good properties for both carrier injection and carrier transport. This can be considered to be the same effect as in the case of the copper complex stated previously.

The temperature of this device was further raised to 92° C., which was higher than the liquid-crystal-phase temperature, and the value of electric current of the device was measured, where it came to be about 12 times the value at room temperature. Thus, it was ascertained that the current characteristics were more improved when the compound is in a liquid crystal phase. This effect can be considered to be due to an improvement of the effect on both the interface charge injection and the in-film charge mobility, because of the compound having a liquid crystal structure.

As described above, the present invention can provide a device, making use of the polyfunctional porphyrin derivative compound which is light-emissive and especially has phosphorescent light emission properties and liquid crystal properties simultaneously, which can emit light at a high efficiency, and has a high stability.

The present invention can also provide a highly luminous and stable light emitting device having a layer containing the above polyfunctional porphyrin derivative compound, and a display unit having such a device.

What is claimed is:

1. A light emitting device comprising a pair of electrodes and, between the pair of electrodes, a light emitting layer comprising a porphyrin derivative compound represented by Formula (1) or (2)

wherein R or R' represents a straight-chain or branched alkyl group which may be substituted with a halogen, provided that the number of carbon atoms contained in the alkyl group is 5 to 20 and one methylene group, or two or more methylene groups not adjacent to each other, in the alkyl group may be replaced with —O—, —S—, —CO—, —CO—O—, —O—CO—, —CH=CH— or —C≡C—; and M is Cr, Ni, Cu, Co, Ru, Rh, Pd, Ir, Pt or Au, which M may be combined with a halogen, an oxygen, —OH or =CO, and wherein the porphyrin compound is a liquid crystalline compound and is capable of emitting light upon application of a voltage to the pair of electrodes.

2. The light emitting device according to claim 1, wherein in said compound represented by Formula (1) the M is Pd, Cu, Pt or Au and the M may be combined with a halogen, an oxygen, —OH or =CO.

3. The light emitting device according to claim 1, wherein the light emission is phosphorescence.

4. The light emitting device according to claim 1, wherein said compound represented by Formula (1) or (2) is capable of charge injection upon application of the voltage to said pair of electrodes.

5. The light emitting device according to claim 1, wherein said compound represented by Formula (1) or (2) has a liquid crystal state in accordance with temperature.

6. The light emitting device according to claim 5, wherein said liquid crystal state is a discotic liquid crystal state.

7. The light emitting device according to claim 1, wherein said compound is represented by Formula (1) where M is Pt.

8. The light emitting device according to claim 1, wherein said compound is represented by Formula (1) where M is Cu.

9. The light emitting device according to claim 1, wherein said compound is represented by Formula (1) where M is Pd.

10. An image display unit comprising the light emitting device according to claim 1, and a drive unit which enables the light emitting device to form a desired image.

* * * * *